United States Patent [19]

Cook et al.

[11] Patent Number: 5,457,345
[45] Date of Patent: Oct. 10, 1995

[54] METALLIZATION COMPOSITE HAVING NICKLE INTERMEDIATE/INTERFACE

[75] Inventors: Herbert C. Cook, Jericho; Paul A. Farrar, Sr., South Burlington; Robert M. Geffken, Burlington; William T. Motsiff, Essex Junction; Adolf E. Wirsing, South Hero, all of Vt.

[73] Assignee: International Business Machines Corporation, Armonk, N.Y.

[21] Appl. No.: 182,310

[22] Filed: Jan. 14, 1994

Related U.S. Application Data

[63] Continuation of Ser. No. 881,097, May 11, 1992, abandoned.

[51] Int. Cl.[6] .......................... H01L 23/48; H01L 29/46; H01L 29/54; H01L 29/62
[52] U.S. Cl. .......................... 257/766; 257/761; 257/762; 257/763; 257/764; 257/765; 257/767; 257/768
[58] Field of Search ..................... 257/766, 768, 257/758, 761, 762, 763, 764, 765, 767, 774

[56] References Cited

U.S. PATENT DOCUMENTS

| | | | |
|---|---|---|---|
| 3,893,160 | 7/1975 | Botzenhardt | 357/71 |
| 3,990,094 | 11/1976 | Konantz et al. | 357/71 |
| 4,096,510 | 6/1978 | Arai et al. | 357/28 |
| 4,176,443 | 12/1979 | Iannuzzi et al. | 29/589 |
| 4,197,551 | 4/1980 | Adlerstein | 357/15 |
| 4,316,208 | 2/1982 | Kobayashi et al. | 357/55 |
| 4,319,264 | 3/1982 | Gangulee et al. | 357/71 |
| 4,742,023 | 5/1988 | Hasegawa | 437/183 |
| 4,840,302 | 6/1989 | Gardner et al. | 257/766 |
| 4,954,870 | 9/1990 | Takemura et al. | 257/766 |

FOREIGN PATENT DOCUMENTS

| | | |
|---|---|---|
| 2930779 | 2/1980 | Germany . |
| 56-37624 | 4/1981 | Japan . |
| 58-15254 | 1/1983 | Japan . |
| 60-119749 | 6/1985 | Japan . |

OTHER PUBLICATIONS

L. F. Miller, IBM Technical Disclosure Bulletin, vol. 16, No. 1, p. 39 (Jun. 1973).

Primary Examiner—Jerome Jackson
Assistant Examiner—Carl Whitehead, Jr.
Attorney, Agent, or Firm—Heslin & Rothenberg

[57] ABSTRACT

A metallization composite comprises a refractory metal, nickel, and copper. The refractory metal is preferably titanium (Ti), but other suitable refractory metals such as zirconium and hafnium can also be utilized. An additional optional layer of gold can overlie the copper. The metallization composite is used to connect a solder contact to a semiconductor substrate.

11 Claims, 6 Drawing Sheets

METALLIZATION COMPOSITE HAVING NICKLE INTERMEDIATE/INTERFACE

This is a continuation of application Ser. No. 07/881,097, filed May 11, 1992, now abandoned.

TECHNICAL FIELD

This invention relates in general to a metallization composite for connecting a solder contact to a semiconductor substrate, and more particularly to a metallization composite comprising a refractory metal, nickel, and copper, with an optional additional gold layer.

BACKGROUND ART

Transistors and other semiconductor components are conventionally assembled in packages in which the various zones of each silicon body are soldered to respective external conductors. It is important that these assembled packages have low resistance contacts.

For many years, it was possible to make a solder contact at vias or contacts of a chip. This involved a process in which a physical mask (such as a molybdenum mask) was fit over a silicon wafer having numerous chips thereon, and held in place with tooling equipment. The contacts or vias were cleaned with a sputter etch process, and the entire assembly was then placed in a vacuum evaporator. Traditionally, a layer of chromium, followed by a layer of chrome-copper phased, followed by a layer of copper and then a layer of gold were deposited by evaporation. Other suitable techniques known to those skilled in the art, such as sputter deposition, could also be utilized. This metal composite has been referred to as a "ball limiting metallurgy" or "pad limiting metallurgy" (BLM or PLM, respectively).

Lead/tin solder was then evaporated upon the metal composite structure, to which the solder was capable of bonding. The mask was then removed and the entire assembly was subjected to temperature sufficient to melt the solder so that a hemispherical solder contact was formed over each via or contact. Depending upon the amount of solder used, the solder contact could be more than hemispherical as with a spherical shape truncated at the bottom.

The resulting chip with the numerous solder connections was then flipped, and the desired substrate was mated to the chip by again subjecting the structure to a temperature sufficient to melt the solder. This further temperature melting joins the solder contacts to the substrate.

This conventional technique for connecting a chip and a substrate via a solder contact had numerous advantages over the previously used methods. One advantage is that the numerous connections were made at one time, which is beneficial for mass production. Another advantage was that melting of the solder operated to self-align the chip and the substrate due to the surface tension of the melting solder. A further advantage was that, unlike a wire bond chip which is limited to a perimeter set of pad connections because a wire must be connected to each, this technique allowed formation of arrays of contacts all over the chip.

Despite these advantages of the chrome copper gold connection method, further developments in the semiconductor technology have revealed disadvantages. For instance, as the semiconductor industry has advanced, the size of silicon wafers has increased from five inches to eight inches. Furthermore, the number of connections desired per chip has increased from around 100–400 to over 1500 per chip. Also, the diameter of the PLM material has decreased from around 150 microns to 100 or less microns. Taking all of these developments into consideration, smaller PLM was desired, with many more PLM connections per chip, and the chips were mounted on larger silicon wafers.

Problems are associated with these developments. For example, the necessary molybdenum mask alignment can be affected by the temperatures required to evaporate the metal composite for connecting the solder contact, due to expansion differences of the various metals used. Furthermore, the technology of making a molybdenum mask limits the diameter of any hole in the mask to the thickness of the mask. Therefore, if a hole of only 100 microns is required in the mask, the molybdenum itself can only be 100 microns thick. This results in a very flexible mask and again causes alignment problems. For financial purposes, it is also desirable to reuse a mask. In order to reuse a mask, it must be removed as an entire structure and cleaned. A very thin, flexible molybdenum mask is likely to be damaged when such attempts at reuse are made.

It is possible to use a photo resist liftoff mask. However, such a photo resist liftoff mask is not compatible with the conventional chrome-copper-gold (Cr—Cu—Au) metallization because the metallization is deposited at room temperature. In order to have reasonable stress levels, the Cr—Cu—Au metallization is, for example, generally deposited above about 150° C. As stated above, this is incompatible with most photo resist liftoff mask procedures.

Additionally, in the production of some semiconductor devices, multiple chip join cycles and rework are required. This leads to a problem of failure at one or more interfaces of multi-layer metal structures used in the device. Furthermore, failure can be accelerated by exposure to required process chemicals, such as perchlorethylene and chlorine/flux mixtures, or exposure during required heating cycles. The degree of damage is cumulative with multiple flux applications, reflows (365° C.), and flux clean cycles, even with xylene solvents.

A need thus exists for a way to connect chips on a silicon wafer to a substrate using solder contacts, in which the problems of earlier connection methods are overcome. The new method should also overcome the problems of interface failure encountered with multilayer metal composites.

DISCLOSURE OF INVENTION

This need is met, and the problems of prior connecting methods overcome, by the metallization composite or pad limiting metallurgy (PLM) of the subject invention. The metallization composite comprises a composite of a refractory metal, nickel (Ni), and copper (Cu), wherein the nickel forms an interface between the refractory metal and the copper. The nickel thereby prevents degradation of the metallization composite at the interface, such as degradation by chlorine accelerated corrosion.

The metallization composite can comprise discrete layers if deposited sequentially, or intermetallic layers if deposited simultaneously. Such intermetallics could include, for example, a refractory metal/nickel intermetallic and a nickel/copper intermetallic. Furthermore, interfaces between discrete layers can be formed by the intermetallics. The composition of the metallization composite thus depends upon the method used to form the composite.

The refractory metal layer is preferably titanium (Ti), but other suitable refractory metals known to those skilled in the art can also be utilized. These include, for example, zirconium and hafnium.

An additional optional layer of gold (Au) can overlie the copper layer of the metallization composite.

The metallization composite of the subject invention is not subject to failure at the composite's metal-metal interfaces or other degradation problems. These problems are overcome, in accordance with the invention, by employing the intermediate layer/interface of nickel. It should also be noted that other combinations of metals have been tested, including: Ti/Cu/Ni/Au; Ti/Pd/Cu/Au; Ti/Cu/Pd/Au; Ti/Al/Cu/Au; and Ti/Cr/Cu/Au (Pd=palladium; Cr= chromium). The results in each case were unacceptable, as detailed below.

Thus, in accordance with the subject invention, a Ni layer is interposed between Ti and Cu-Au and the resulting structure is capable of surviving the multiple cleaning and heating cycles imposed by chip joining and rework. For example, the subject metallization composite can withstand at least 12 reflow cycles with 12 flux/perchlor cleaning cycles, and maintain bond integrity to a substrate. The simple Ti—Cu—Au structure fails under these conditions.

Another advantage of one embodiment of the invention is that by using a refractory metal such as titanium as the base layer of the metallization composite (in contact with the aluminum (Al) layer overlying the silicon substrate), the need for sputter cleaning of the aluminum surface is avoided.

A further advantage of this invention is that the metallization composite can be defined by the use of a photo resist liftoff process, for example the modified image reversal process, when deposited at room temperature.

BRIEF DESCRIPTION OF DRAWINGS

The foregoing and other objects, features and advantages of the invention will be apparent from the following more particular description of preferred embodiments of the invention as illustrated in the accompanying drawings in which.

BEST MODE FOR CARRYING OUT THE INVENTION

Figure 1:
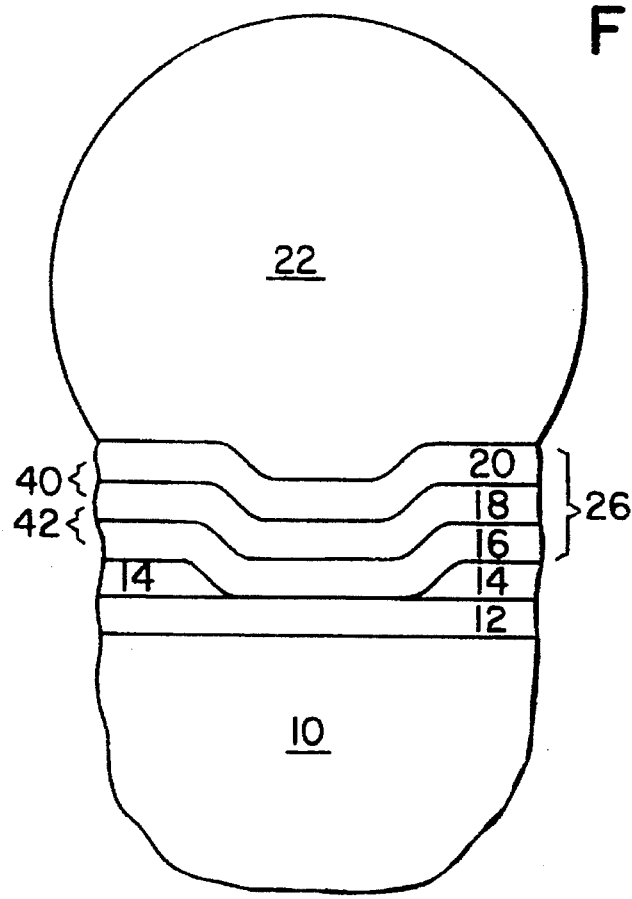
FIG. 1 is a cross-sectional elevational view of a metallization composite connecting a semiconductor substrate to a solder contact according to one embodiment of the subject invention.

The broad concept of the subject invention is directed to a metallization composite for connecting a solder contact to a semiconductor substrate. As shown in FIG. 1, a silicon substrate 10 is provided, over which metal layer 12 such as aluminum has been applied. A contact via is formed in an insulation layer 14, such as silicon nitride, silicon dioxide, or polyimide. The contact via extends to the metal layer 12. The metallization composite 26 is then applied, followed by evaporation of a solder contact 22 (or other suitable means of applying the solder known to those skilled in the art, such as plating). The solder contact 22 preferably comprises lead-tin solder (PbSn), but could comprise any suitable solder known to those skilled in the art. For example, bismuth solders could also be used. It should be noted that in semiconductor device fabrication multiple layers of metal and insulation can be applied, with each layer providing an opening to a specific contact point on the semiconductor substrate.

The metallization composite 26 comprises a refractory metal layer 16, a nickel layer 18, and a copper layer 20. The metallization composite can comprise discrete layers if deposited sequentially, or intermetallic layers if deposited simultaneously. Such intermetallics could include, for example, a refractory metal/nickel intermetallic and a nickel/copper intermetallic. As shown in FIG. 1, the intermetallics can also form the interfaces between the discrete layers. Specifically, a metal/nickel intermetallic 42 and a nickel/copper intermetallic 40 are shown. The composition of the metallization composite thus depends in part upon the method used to form the composite, such that discrete layers or intermetallics are formed, or a combination of both.

The refractory metal layer 16 is preferably titanium (Ti), but other suitable refractory metals known to those skilled in the art can also be utilized. These include, for example, zirconium and hafnium. Any refractory metal that has high solubility for oxygen in the solid phase is suitable. This enables the refractory metal to reduce any oxide present on the surface upon which the metallization composite is formed. This eliminates the need to sputter clean prior to depositing the refractory metal layer.

Figure 2:
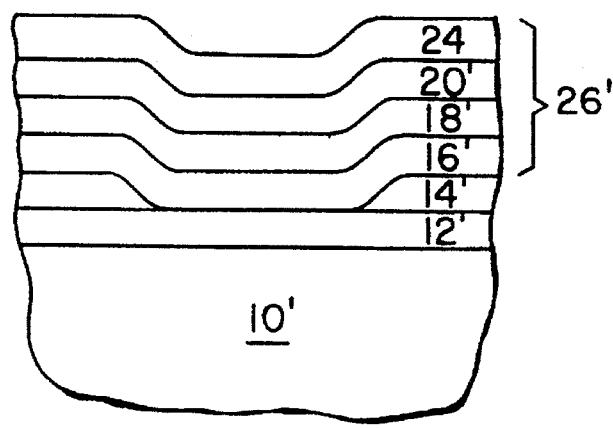
FIG. 2 is a cross-sectional elevational view of a further embodiment of a metallization composite of the subject invention.

An additional optional layer, for example of gold (Au), can form the uppermost layer of the metallization composite. This layer of gold 24 is shown in FIG. 2 overlying the copper layer 20'. In the process of forming the metallization composite connection, the metallization composite 26' is formed in one evaporation phase, and the solder contact (see FIG. 1) is added in an additional evaporation phase. During the transfer between phases, the metallization composite can be exposed to the atmosphere. The gold layer 24 acts as a barrier which is not oxidized by the atmosphere when the transfer occurs. Therefore, no oxidation layer can form upon the metallization composite prior to the application of the solder contact. This is important because an oxidation layer interferes with solder application. It should be readily apparent to those skilled in the art that any other suitable optional layer can be utilized, as long as the layer provides this desired barrier effect. Upon subsequent heating to connect the solder contact, the gold layer 24 is dissolved as it forms quaternary compounds with the solder contact.

Having thus described the main components of the subject invention, one embodiment of the subject invention utilizes the following thicknesses for each of the layers:

| Metal | Thickness (Angstroms) |
| --- | --- |
| refractory | 300–1500 or more |
| nickel | 400–1000 |
| copper | 2000–20000 |
| gold | more than 700, preferably 1100 |

The indicated ranges are exemplary only. The refractory metal should be of a thickness capable of reducing the amount of aluminum oxide underlying the metallization composite, without adversely affecting the composite properties. For an aluminum oxide thickness of about 40 or 50 angstroms, 300 angstroms of refractory metal is required. This is sufficient to reduce the aluminum oxide and still leave enough refractory metal to react with the nickel. The nickel should be in a range of about 400 to about 1000 angstroms. The variable range is discussed further below. The preferred range of copper is about 2000 to about 20000 angstroms. The copper should be thick enough to provide sufficient copper for the solder to connect to, or thick enough to act as an electrical connection if used as a wiring level. The thickness of the gold is that amount necessary to protect the underlying copper, as discussed above.

Figure 3:
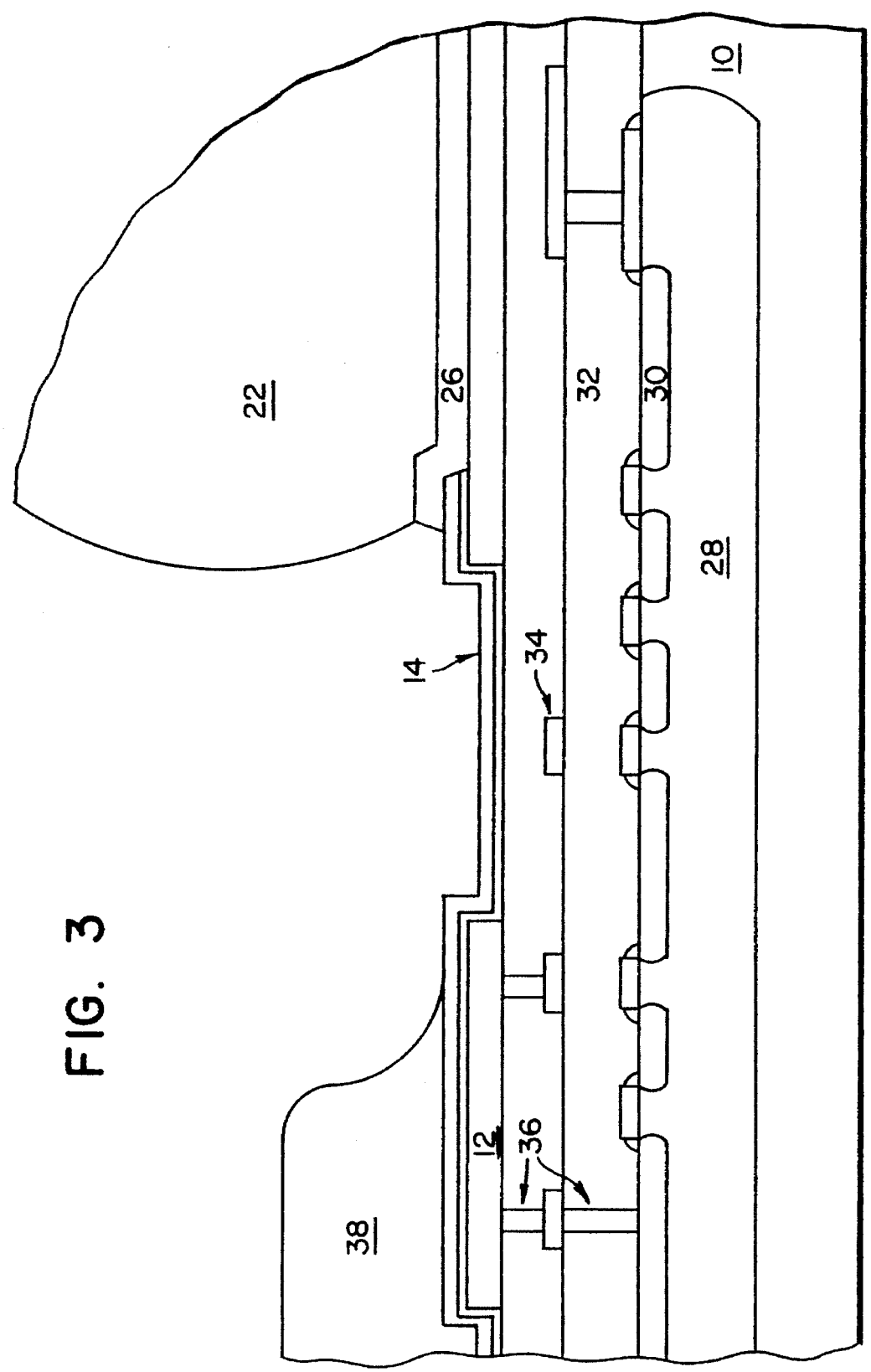
FIG. 3 is a cross-sectional elevational view of the structure shown in FIG. 1 incorporated into a semiconductor device.

The use of the metallization composite 26 is best illustrated in FIG. 3. As shown, a semiconductor device 10 includes an N-well 28 with p-diffusion regions 30. A polysilicon region 32 includes tungsten contact/vias 36 to the aluminum layer 12. Tungsten contacts 34 are also included. Overlying the aluminum layer 12 is the dry etched nitride/oxide layer 14. The pad limiting metallurgy (PLM) metallization composite 26 of the subject invention overlies the nitride/oxide layer 14, and provides a connection for the solder contact 22. Also shown in FIG. 3 is the wet/dry etched polyimide layer 38 common in semiconductor devices.

Figure 4:
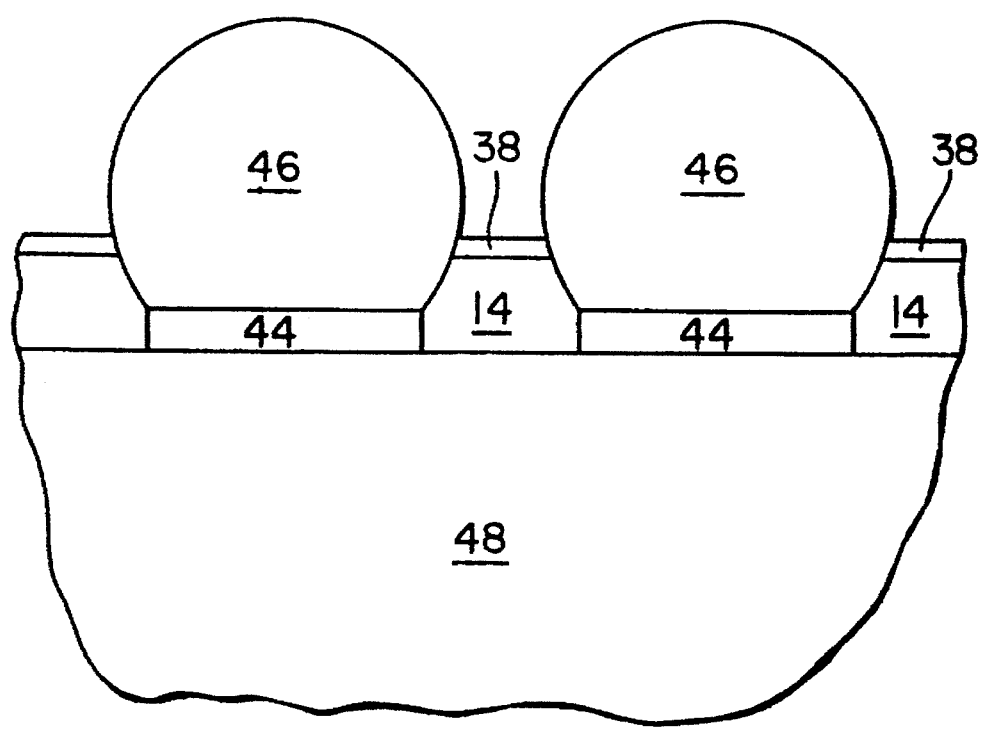
FIG. 4 is a cross-sectional elevational view of one embodiment of the metallization composite of the subject invention in use as a wiring layer.

As will be readily apparent to those skilled in the art, the metallization composite of the subject invention can also be used as a wiring layer as shown in FIG. 4. FIG. 4 shows the chip 48 to which the metallization composite 44 has been deposited where desired contacts will be made. The solder contact 46 is bound directly to the metallization composite 44 as discussed above. This embodiment differs from those discussed above in that the metallization composite 44 replaces the aluminum layer of the prior embodiments as the wiring layer, when the contact areas for the solder 46 are defined by the opening to the polyimide layer 38 and/or the nitride/oxide layer 14.

The metallization composite could also be used by depositing it on a semiconductor substrate, while the solder contact is deposited on the portion of the entire device which will be connected to the semiconductor substrate using the metallization composite. The portion with the metallization composite is brought into contact with the portion having the solder contact, and the two portions are heated to achieve the required device. It should also be apparent to those skilled in the art that the metallization composite which is the subject invention can also be utilized in other applications, such as the formation of interconnects.

The metallization composite can be made by any means known to those skilled in the art. In one embodiment, the individual metal layers that make up the metallization composite are sequentially deposited by evaporation. The metallization composite can comprise such discrete layers if deposited sequentially, or can comprise intermetallic layers if deposited simultaneously. Such intermetallics could include, for example, a refractory metal/nickel intermetallic and a nickel/copper intermetallic. As shown in FIG. 1, the intermetallics can also form the interfaces between the discrete layers. Specifically, a metal/nickel intermetallic 42 and a nickel/copper intermetallic 40 are shown. The composition of the metallization composite thus depends in part upon the method used to form the composite, such that discrete layers or intermetallics are formed, or a combination of both.

In practice, it may be preferable to deposit the refractory metal for a period of time. The nickel deposition would overlap the refractory metal deposition for a period of time and then keep going. The copper deposition would overlap the nickel deposition for a period of time and then keep going. This results in intermetallic formations at the interfaces, and eliminates any possibility of surface contamination between discrete evaporations. As should be readily apparent to those skilled in the art, the specific method of depositing the composite can vary. Evaporation is one example, and sputter deposition is another example of a suitable deposition method. The desired use of the composite would influence the choice of deposition means.

The layers of the metallization composite can be defined by any means known to those skilled in the art. In one embodiment, a liftoff photo process is utilized, such as a modified image reversal process. Other suitable means, such as reactive ion etching, could also be utilized.

The solder contact is also formed by evaporation, or other suitable means. After the metallization composite has been deposited, the solder is evaporated onto the composite. It should be noted that in the resulting structure, the heating required to form the solder contact can cause a diffusion of one layer into another, such that the resulting structure, after heating, can comprise layers of various components. For example, the tin of the solder may diffuse into the copper layer, and the nickel may diffuse into the titanium layer. The lead of the solder may remain in substantially pure form after the tin has diffused.

Superior results are obtained with the metallization composite of the subject invention due to the presence of the nickel in the composite, which operates as an interface between the refractory metal and the copper. This nickel interface prevents degradation at the interface, such as that caused by chlorine. Chlorine generally accelerates corrosion and degradation in the absence of such a nickel interface. The metallization composite of the subject invention can therefore withstand the stresses common in semiconductor processing. On the contrary, experimental data indicates that other combinations of metal-metal layers do not result in a metallization composite with such satisfactory properties.

Figure 5:
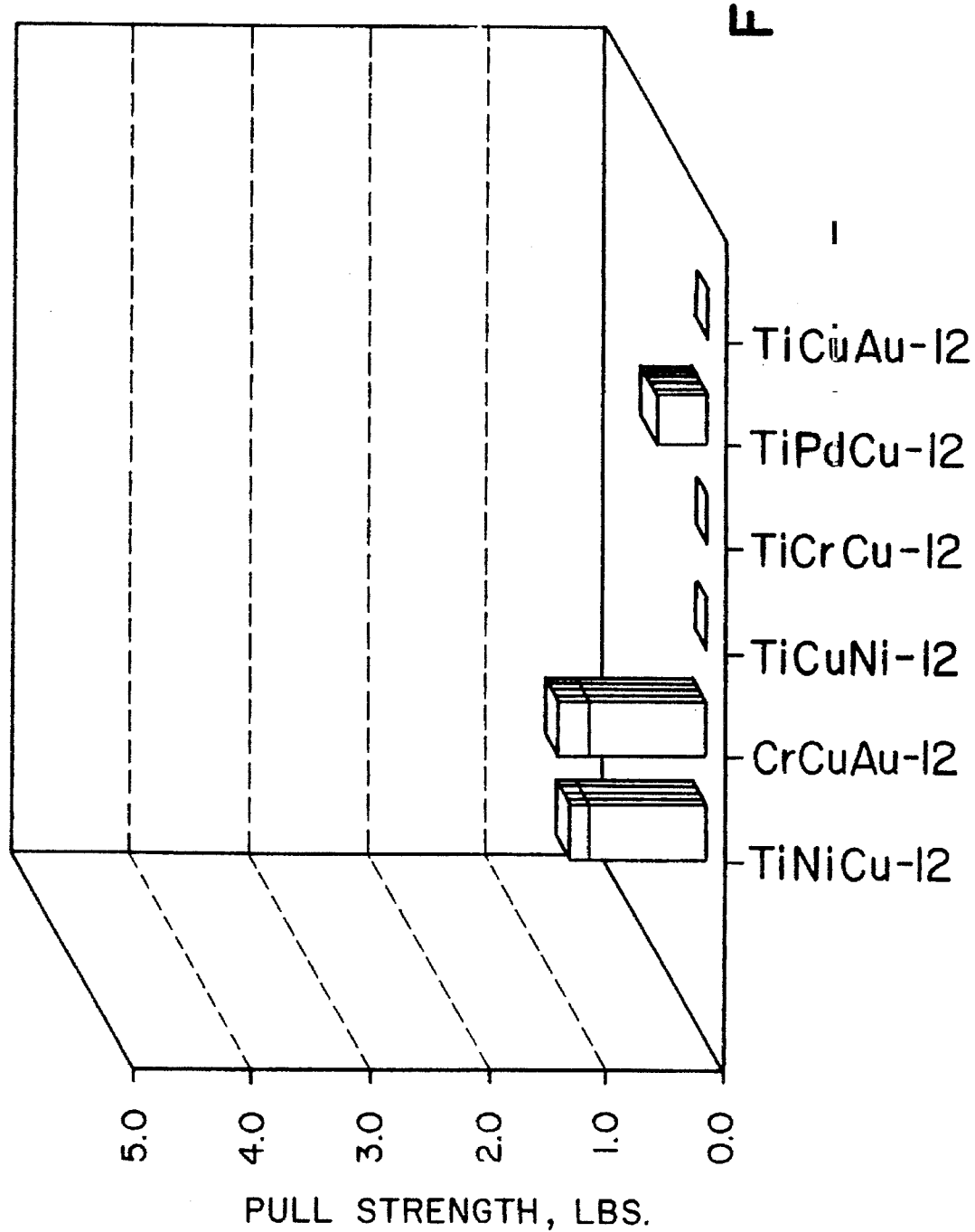
FIG. 5 is a graph illustrating and comparing the pull strength of the metallization composite of the subject invention and other metallization composites after 12 reflows.
Figure 6:
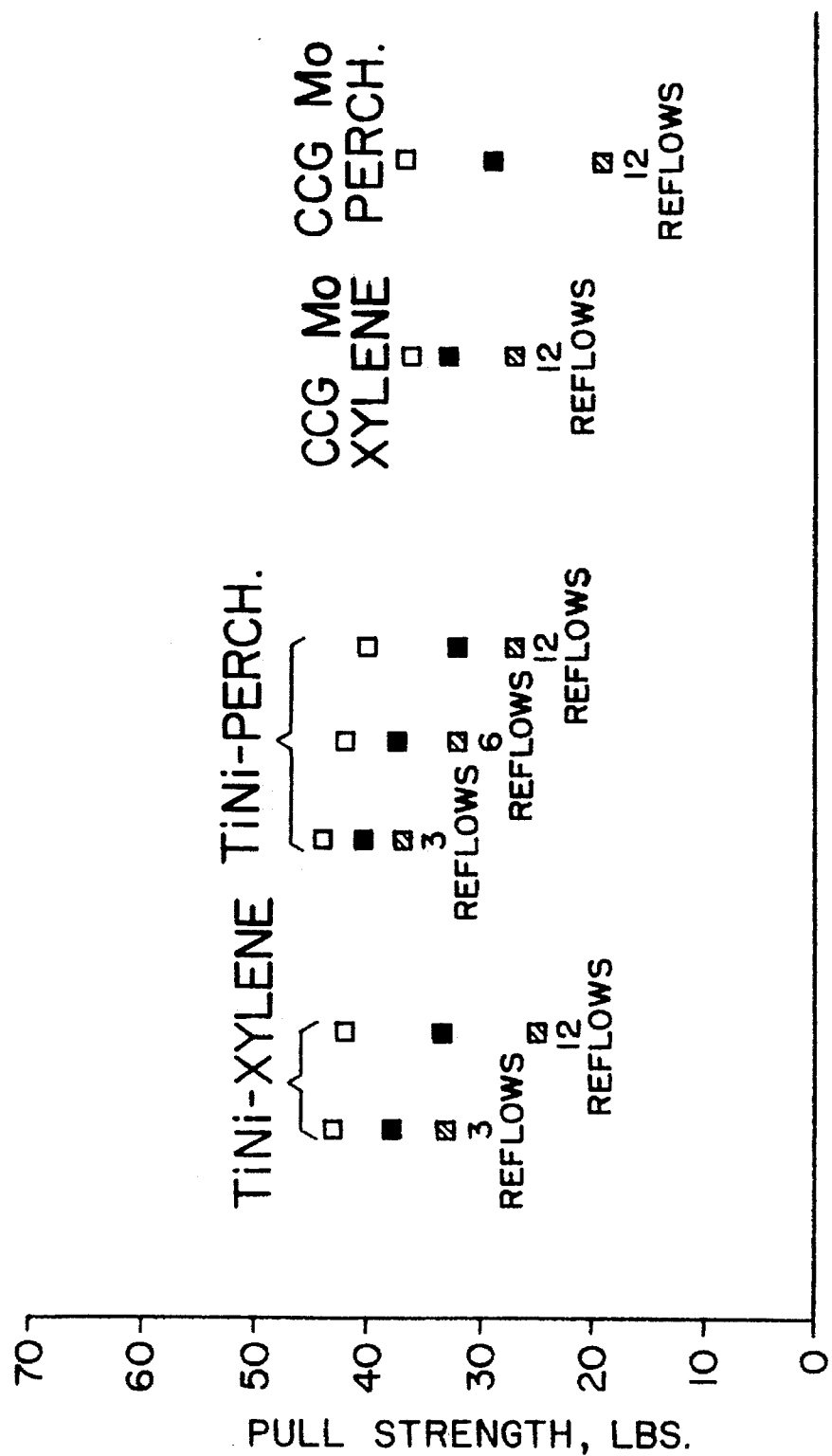
FIG. 6 is a graph illustrating and comparing the pull strength of the metallization composite of the subject invention and other metallization composites after various reflows.
Figure 7:
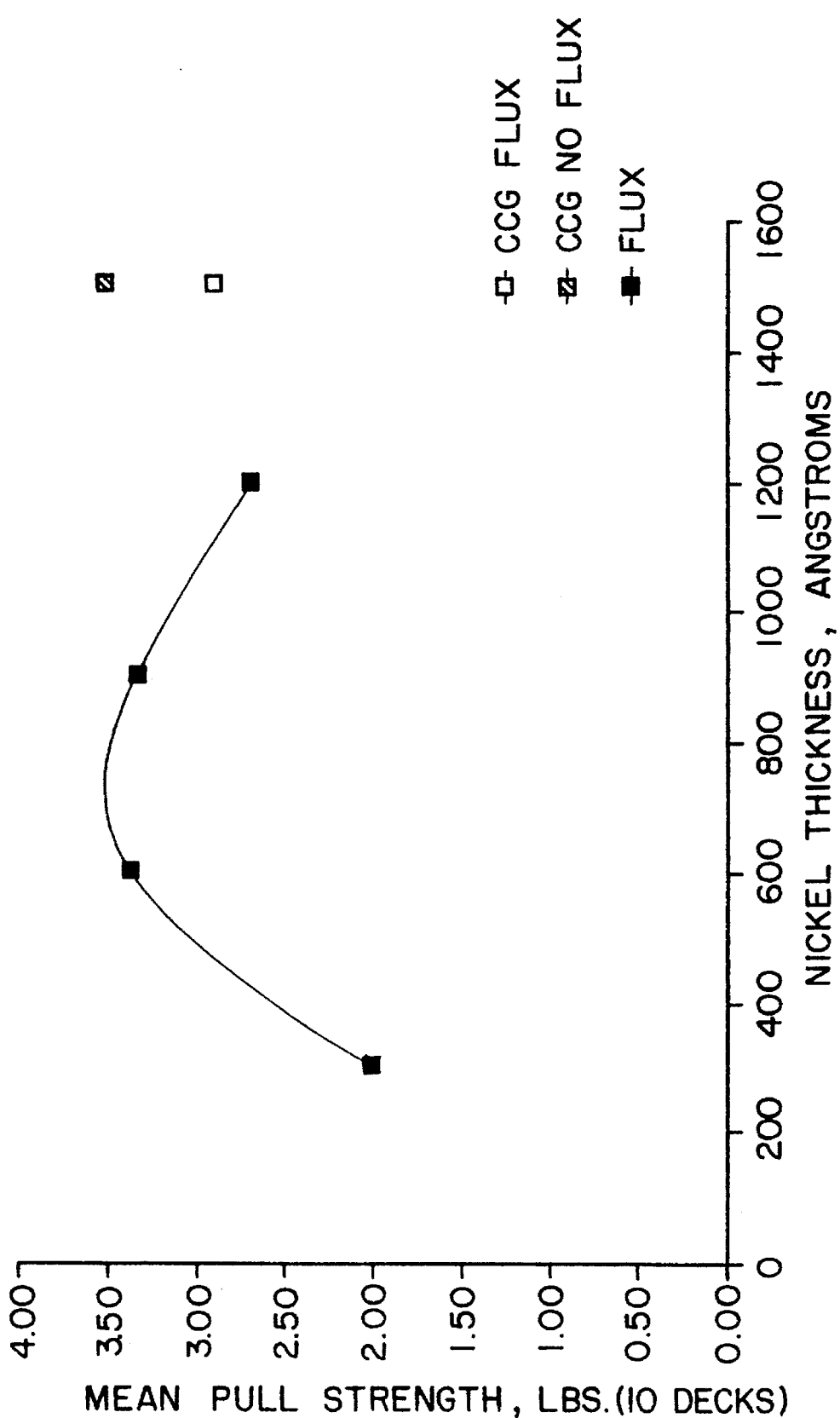
FIG. 7 is a graph illustrating the effect of nickel thickness on pull strength.

These superior results are summarized in FIGS. 5–7. FIG. 5 compares the minimum pull strength of the TiNiCu composite with the conventional CrCuAu composite and various other composites. The pull strength in lbs. is determined after 12 reflow/flux/perchlor cycles, as would be required with semiconductor device fabrication. The minimum pull strength of TiNiCu is substantially equivalent to the CrCuAu minimum pull strength, and thus is a superior replacement for this conventional composite. The superiority results from the lack of a sputter clean requirement, as well as the ability to make very small PLM's in large quantity on a semiconductor substrate (see discussion above). This was not possible with the CrCuAu composite.

More important, visual and scanning electron microscopy (SEM) inspection shows both the TiNiCu and CrCuAu structures to have a ductile solder fail mode (taffy pulls)— the desired fail mode for good thermal fatigue life (high reliability). Failure can occur in the solder such that the solder stretches out due to its ductile nature. This is referred to as a ductile fracture. Failure can also occur at the interface where there is no ductility, resulting in a brittle fracture. Ductile fracture is preferable to brittle fracture where thermal processing is required, such as in semiconductor processing. The specific structure used in this work was Ti=1500 Angstroms, Ni=600 Angstroms, Cu=5000 Angstroms (optional Au=1100 Angstroms). Note that the TiCuNi, TiCrCu, TiPdCu, and TiCuAu minimum pull strengths were inferior by at least 50% to the TiNiCu composite.

Further comparisons of the TiNiCu metal composite with the CrCuAu composite are provided in FIG. 6. FIG. 6 provides in graph format the pull strength in lbs. of the TiNi composite cleaned in xylene with 3 and 12 reflows; of the TiNi composite cleaned in perchlor with 3, 6, and 12 reflows; of the CrCuAu composite cleaned in xylene with 12 reflows; and of the CrCuAu composite cleaned in perchlor with 12 reflows. The perchlor reflow should bring about any chlorine degradation that may occur, thus affecting pull strength. As was shown in FIG. 6, the TiNi composite is superior to the CrCu composite with either xylene or perchlor reflows of 3 or 12. This data clearly illustrates that the chlorine often present as a trace element in processing, required for the manufacturing of various semiconductor devices, does not present a problem with the metallization composite of the subject invention. The chlorine does not accelerate degradation or corrosion of the metallization composite due to the nickel layer/interface of the subject invention. The pull strength data confirms this property.

FIG. 7 illustrates the range of nickel thickness which provides the benefits desired. As shown, a nickel thickness of about 400 to about 1000 angstroms results in a satisfactory pull strength. Below about 400 the nickel does not provide a suitable barrier to chlorine corrosion, and above about 1000 the titanium/nickel interface began to delaminate due to the stress thickness product of the nickel layer. Thus, the process window for nickel thickness according to the metallization composite of the subject invention is about 400 to about 1000 angstroms.

While the invention has been particularly shown and described with reference to preferred embodiments thereof, it will be understood by those skilled in the art that various changes in form and details may be made therein without departing from the spirit and scope of the invention.

We claim:

1. A metallization composite for connecting a solder contact to a semiconductor substrate comprising:
   a layer of refractory metal having a thickness of 300–1500 Angstroms, said refractory metal selected from the group consisting of titanium, hafnium, and zirconium;
   a layer of nickel having a thickness of 400–1000 Angstroms overlying said refractory metal layer; and
   a layer of copper having a thickness of 2000–20000 Angstroms overlying said nickel layer.

2. The metallization composite of claim 1 further comprising a layer of gold having a thickness of at least 700 Angstroms overlying said copper layer.

3. The metallization composite of claim 1 further comprising a refractory metal/nickel intermetallic layer between said layer of a refractory metal and said layer of nickel.

4. The metallization composite of claim 1 further comprising a nickel/copper intermetallic layer between said layer of nickel and said layer of copper.

5. The metallization composite of claim 1 wherein said refractory metal comprises titanium.

6. A semiconductor device comprising:
   a semiconductor substrate having a top surface thereof; and
   a metallization composite overlying said top surface;
   wherein said metallization composite comprises a layer of a refractory metal having a thickness of 300–1500 Angstroms overlying said top surface, said refractory metal selected from the group consisting of titanium, hafnium, and zirconium; a layer of nickel having a thickness of 400–1000 Angstroms overlying said layer of a refractory metal; and a layer of copper having a thickness of 2000–20000 Angstroms overlying said layer of nickel.

7. A semiconductor device comprising:
   a semiconductor substrate having a top surface thereof;
   a metal layer overlying said top surface of said semiconductor substrate;
   an insulation layer overlying said metal layer, said insulation layer having an opening therein to said metal layer;
   a metallization composite overlying said insulation layer and occupying said opening in said insulation layer, said metallization composite thereby contacting said metal layer; and
   a lead-tin solder layer overlying said metallization composite;
   wherein said metallization composite comprises a layer of a refractory metal having a thickness of 300–1500 Angstroms overlying said insulation layer, said refractory metal selected from the group consisting of titanium, hafnium, and zirconium; a layer of nickel having a thickness of 400–1000 Angstroms overlying said layer of a refractory metal; and a layer of copper having a thickness of 2000–20000 Angstroms overlying said layer of nickel and underlying said lead-tin solder layer.

8. The semiconductor device of claim 7 wherein said semiconductor substrate comprises a silicon wafer.

9. The semiconductor device of claim 7 wherein said metal layer comprises aluminum.

10. The semiconductor device of claim 7 wherein said insulation layer is selected from the group consisting of silicon nitride, silicon dioxide, and polyimide.

11. A metallization composite for connecting a solder contact to a semiconductor substrate comprising:
    a layer of refractory metal having a thickness of 300–1500 Angstroms, said refractory metal selected from the group consisting of titanium, hafnium, and zirconium;
    a layer of nickel having a thickness of 400–1000 Angstroms overlying said refractory metal layer;
    a layer of copper having a thickness of 2000–20000 Angstroms overlying said nickel layer; and
    a layer of gold having a thickness of at least 700 Angstroms overlying said copper layer.

* * * * *